(12) United States Patent
Kobayashi et al.

(10) Patent No.: US 12,131,940 B2
(45) Date of Patent: Oct. 29, 2024

(54) TEMPERATURE CONTROL DEVICE

(71) Applicant: KELK Ltd., Kanagawa (JP)

(72) Inventors: Atsushi Kobayashi, Kanagawa (JP);
Masato Horikoshi, Kanagawa (JP);
Hideaki Ohkubo, Kanagawa (JP);
Wataru Kiyosawa, Kanagawa (JP)

(73) Assignee: KELK Ltd., Kanagawa (JP)

( * ) Notice: Subject to any disclaimer, the term of this patent is extended or adjusted under 35 U.S.C. 154(b) by 473 days.

(21) Appl. No.: 17/291,466

(22) PCT Filed: Oct. 30, 2019

(86) PCT No.: PCT/JP2019/042611
§ 371 (c)(1),
(2) Date: May 5, 2021

(87) PCT Pub. No.: WO2020/095794
PCT Pub. Date: May 14, 2020

(65) Prior Publication Data
US 2022/0005727 A1    Jan. 6, 2022

(30) Foreign Application Priority Data
Nov. 9, 2018   (JP) .................................. 2018-211417

(51) Int. Cl.
*H10N 10/17*   (2023.01)
*H01L 21/687*   (2006.01)

(52) U.S. Cl.
CPC ....... *H01L 21/68714* (2013.01); *H10N 10/17* (2023.02)

(58) Field of Classification Search
CPC .......................... H01L 21/68714; H10N 10/17
See application file for complete search history.

(56) References Cited

U.S. PATENT DOCUMENTS

| | | | |
|---|---|---|---|
| 6,838,646 B2 | 1/2005 | Inazumachi et al. | |
| 7,978,963 B2 | 7/2011 | Shimizu et al. | |
| 8,623,173 B2 | 1/2014 | Son | |
| 9,816,519 B2* | 11/2017 | Nowitzki | ................ F04D 13/10 |
| 10,879,053 B2 | 12/2020 | Ricci et al. | |

(Continued)

FOREIGN PATENT DOCUMENTS

| | | |
|---|---|---|
| CN | 1856863 | 11/2006 |
| CN | 101989596 A | 3/2011 |

(Continued)

OTHER PUBLICATIONS

KR Notice of Allowance in Korean Appln. No. 10-2021-7012616, dated Mar. 15, 2023, 5 pages (with English Translation).

(Continued)

*Primary Examiner* — Anthony Q Edwards
*Assistant Examiner* — Hung Q Dang
(74) *Attorney, Agent, or Firm* — Fish & Richardson P.C.

(57) ABSTRACT

A temperature control device includes: a top plate that supports a substrate; a base plate connected to the top plate so as to form an internal space with the top plate; a thermoelectric module plate arranged in the internal space; a heat exchange plate that is arranged in the internal space and exchanges heat with the thermoelectric module plate; and a sealing member that comes into contact with each of the top plate and the base plate.

8 Claims, 6 Drawing Sheets

(56) References Cited

U.S. PATENT DOCUMENTS

| | | |
|---|---|---|
| 2004/0065259 A1 | 4/2004 | Inazumachi et al. |
| 2008/0230180 A1 | 9/2008 | Yoneda et al. |
| 2014/0356985 A1 | 12/2014 | Ricci et al. |
| 2017/0011890 A1 | 1/2017 | Aramaki et al. |
| 2017/0110298 A1* | 4/2017 | Ricci ................ H01L 21/67109 |
| 2021/0159055 A1 | 5/2021 | Aramaki et al. |

FOREIGN PATENT DOCUMENTS

| | | |
|---|---|---|
| JP | 2002353298 | 12/2002 |
| JP | 2004104113 A | 4/2004 |
| JP | 2007-311656 A | 11/2007 |
| JP | 2009094138 | 4/2009 |
| JP | 2015008287 | 1/2015 |
| JP | 2016082077 | 5/2016 |
| JP | 2017022216 | 1/2017 |
| KR | 20140142177 A | 12/2014 |
| KR | 10-1840231 B1 | 3/2018 |
| TW | 200913798 | 3/2009 |
| TW | 201203349 | 1/2012 |
| TW | 201511174 A | 3/2015 |
| TW | 201703101 | 1/2017 |

OTHER PUBLICATIONS

PCT International Search Report in International Application No. PCT/JP2019/042611, dated Dec. 17, 2019, 5 pages (with English translation).

KR Office Action in Korean Appln. No. 10-2021-7012616, dated Sep. 15, 2022, 8 pages (with English Translation).

Office Action in Chinese Appln. No. 201980073575.7, dated Nov. 23, 2023, 12 pages (with machine translation).

* cited by examiner

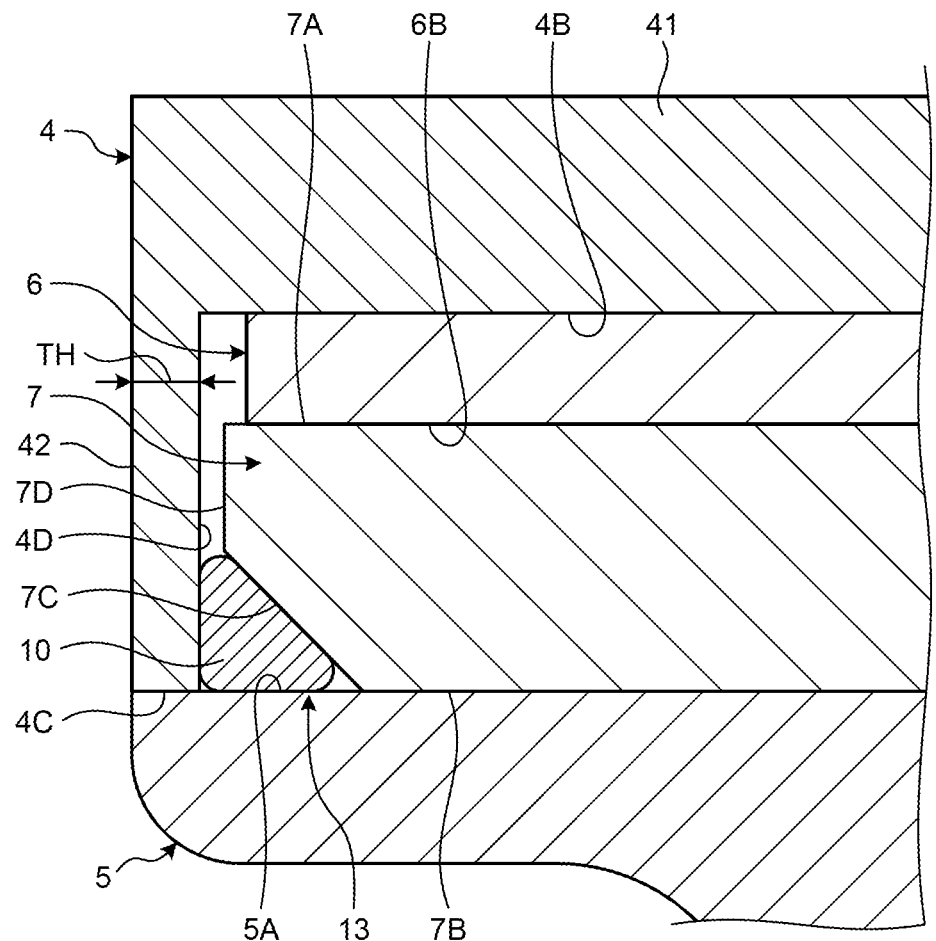
FIG.6
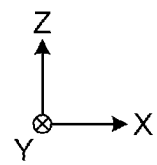

TEMPERATURE CONTROL DEVICE

CROSS-REFERENCE TO RELATED APPLICATIONS

This application is a National Stage application of International Application No. PCT/JP2019/042611, filed on Oct. 30, 2019, which claims priority to Japanese Patent Application No. 2018-211417, filed on Nov. 9, 2018. The contents of the prior applications are incorporated herein in their entirety.

FIELD

The present invention relates to a temperature control device.

BACKGROUND

In a process of manufacturing semiconductor devices, various semiconductor processing apparatuses, such as a film deposition apparatus that performs a film deposition process on the substrate, an exposure apparatus that performs an exposure process of the substrate, and an etching apparatus that performs an etching process of the substrate, are used. The semiconductor processing apparatus is provided with a temperature control device that adjusts the temperature of the substrate in many cases. For example, when a dry etching process is performed on a substrate, an etching rate is affected by the temperature of the substrate so that the dry etching process is performed while adjusting the temperature of the substrate by the temperature control device. Patent Literature 1 discloses a substrate support assembly that adjusts the temperature of a substrate in a vacuum chamber of a semiconductor processing apparatus. In Patent Literature 1, the substrate support assembly functions as a temperature control device. The substrate support assembly has a top plate that supports the substrate, a base plate arranged below the top plate, and a cover plate arranged between the top plate and the base plate. A thermoelectric module is arranged in an internal space between the cover plate and the base plate. The internal space in which the thermoelectric module is arranged is maintained at atmospheric pressure.

CITATION LIST

Patent Literature

Patent Literature 1: JP 2015-008287 A

SUMMARY

Technical Problem

When two members forming the internal space are joined by an adhesive in a case where the temperature control device is used in a high-temperature environment, there is a possibility that the adhesive may be peeled off due to a difference in the amount of thermal deformation between the two members. As a result, there is a possibility that a gas may flow out from the internal space to an external space, or a gas may flow in from the external space to the internal space.

An aspect of the present invention aims to suppress the flow of a gas between an internal space and an external space in a temperature control device having the internal space in which a thermoelectric module is arranged.

Solution to Problem

According to an aspect of the present invention, a temperature control device comprises: a top plate that supports a substrate; a base plate connected to the top plate so as to form an internal space with the top plate; a thermoelectric module plate arranged in the internal space; a heat exchange plate that is arranged in the internal space and exchanges heat with the thermoelectric module plate; and a sealing member that comes into contact with each of the top plate and the base plate.

Advantageous Effects of Invention

According to an aspect of the present invention, it is possible to suppress the flow of the gas between the internal space and the external space in the temperature control device having the internal space in which the thermoelectric module is arranged.

BRIEF DESCRIPTION OF DRAWINGS

FIG. 6 is a cross-sectional view illustrating an example of a sealing member according to the first embodiment.

DESCRIPTION OF EMBODIMENTS

Hereinafter, embodiments of the present invention will be described with reference to the drawings, but the present invention is not limited thereto. Components of the embodiments to be described below can be combined as appropriate. In addition, there is also a case where some components are not used.

In the following description, an XYZ orthogonal coordinate system is set, and positional relations of the respective portions will be described with reference to this XYZ orthogonal coordinate system. A direction parallel to an X axis in a predetermined plane is defined as an X-axis direction. A direction parallel to a Y axis orthogonal to the X axis in the predetermined plane is defined as a Y-axis direction. A direction parallel to a Z axis orthogonal to the predetermined plane is defined as a Z-axis direction. An XY plane including the X axis and Y axis is parallel to the predetermined plane. A YZ plane including the Y axis and Z axis is orthogonal to the XY plane. An XZ plane including the X axis and Z axis is orthogonal to each of the XY plane and YZ plane. In the present embodiment, the XY plane is parallel to the horizontal plane. The Z-axis direction is the vertical direction. The +Z direction (+Z side) is the upward direction (upper side). The −Z direction (−Z side) is the downward direction (lower side). Note that the XY plane may be inclined with respect to the horizontal plane.

First Embodiment

Semiconductor Processing Apparatus

Figure 1:
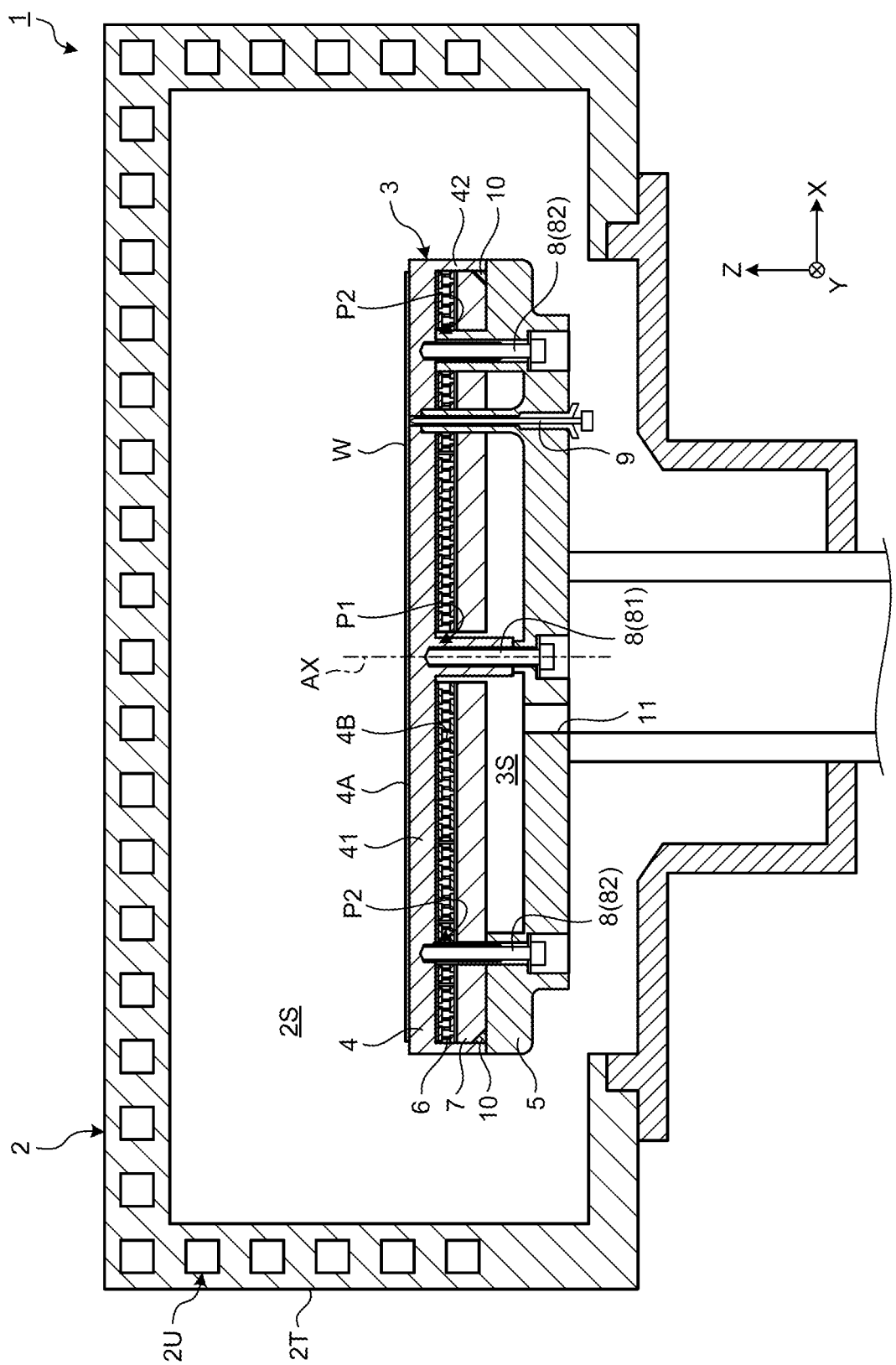
FIG. 1 is a cross-sectional view schematically illustrating an example of a semiconductor processing apparatus according to a first embodiment.

A first embodiment will be described. FIG. 1 is a cross-sectional view schematically illustrating an example of a semiconductor processing apparatus 1 according to the present embodiment. As illustrated in FIG. 1, the semiconductor processing apparatus 1 includes a chamber device 2 and a temperature control device 3 that is arranged in an internal space 2S of the chamber device 2 and adjusts the temperature of a substrate W in the internal space 2S.

In the present embodiment, the semiconductor processing apparatus 1 includes a dry etching device that performs a dry etching process on the substrate W. The substrate W includes a semiconductor wafer. In the dry etching process, the pressure in the internal space 2S of the chamber device 2 is adjusted to a pressure lower than atmospheric pressure. The pressure in the internal space 2S is adjusted to be, for example, 200 [Pa]. In the dry etching process, the temperature of the substrate W is adjusted by the temperature control device 3. An etching gas is supplied to the internal space 2S of the chamber device 2 in a state where the internal space 2S of the chamber device 2 is depressurized and the temperature of the substrate W is adjusted. As the etching gas is supplied to the internal space 2S, the substrate W is dry-etched.

The temperature control device 3 adjusts the temperature of the substrate W in a state of supporting the substrate W. The temperature control device 3 can adjust an etching rate by adjusting the temperature of the substrate W. In addition, the temperature control device 3 can adjust the temperature distribution of the substrate W.

The chamber device 2 has a chamber member 2T forming the internal space 2S and a temperature adjustment device 2U that adjusts the temperature of the chamber member 2T. When the chamber member 2T is heated by the temperature adjustment device 2U, there is a possibility that the temperature of the substrate W supported by the temperature control device 3 becomes excessively higher than a target temperature, or the temperature distribution of the substrate W does not reach a target temperature distribution. The temperature control device 3 adjusts the temperature of the substrate W such that the substrate W reaches the target temperature even when the chamber member 2T is heated. The temperature control device 3 adjusts the temperature distribution of the substrate W such that the substrate W has the target temperature distribution even when the chamber member 2T is heated.

Temperature Control Device

Figure 2:
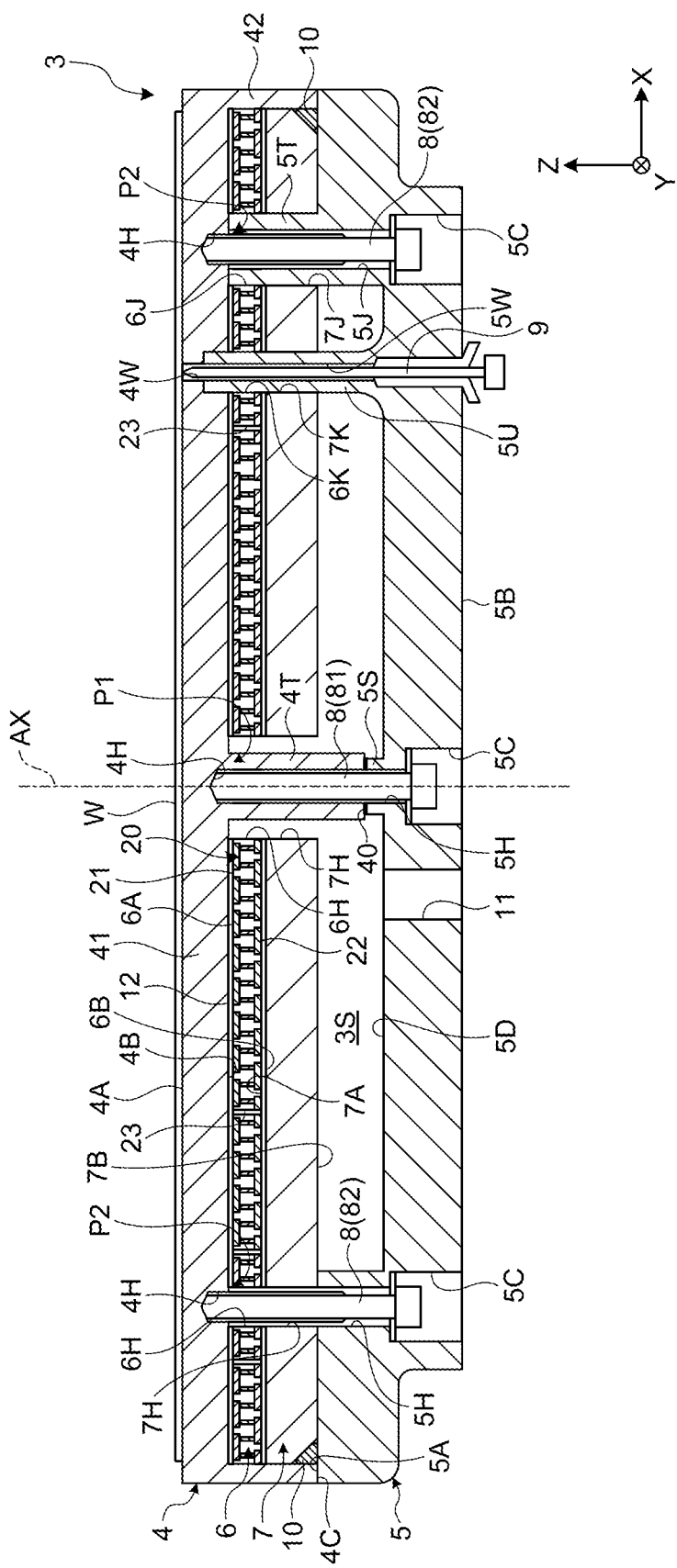
FIG. 2 is a cross-sectional view schematically illustrating an example of a temperature control device according to the first embodiment.
Figure 3:
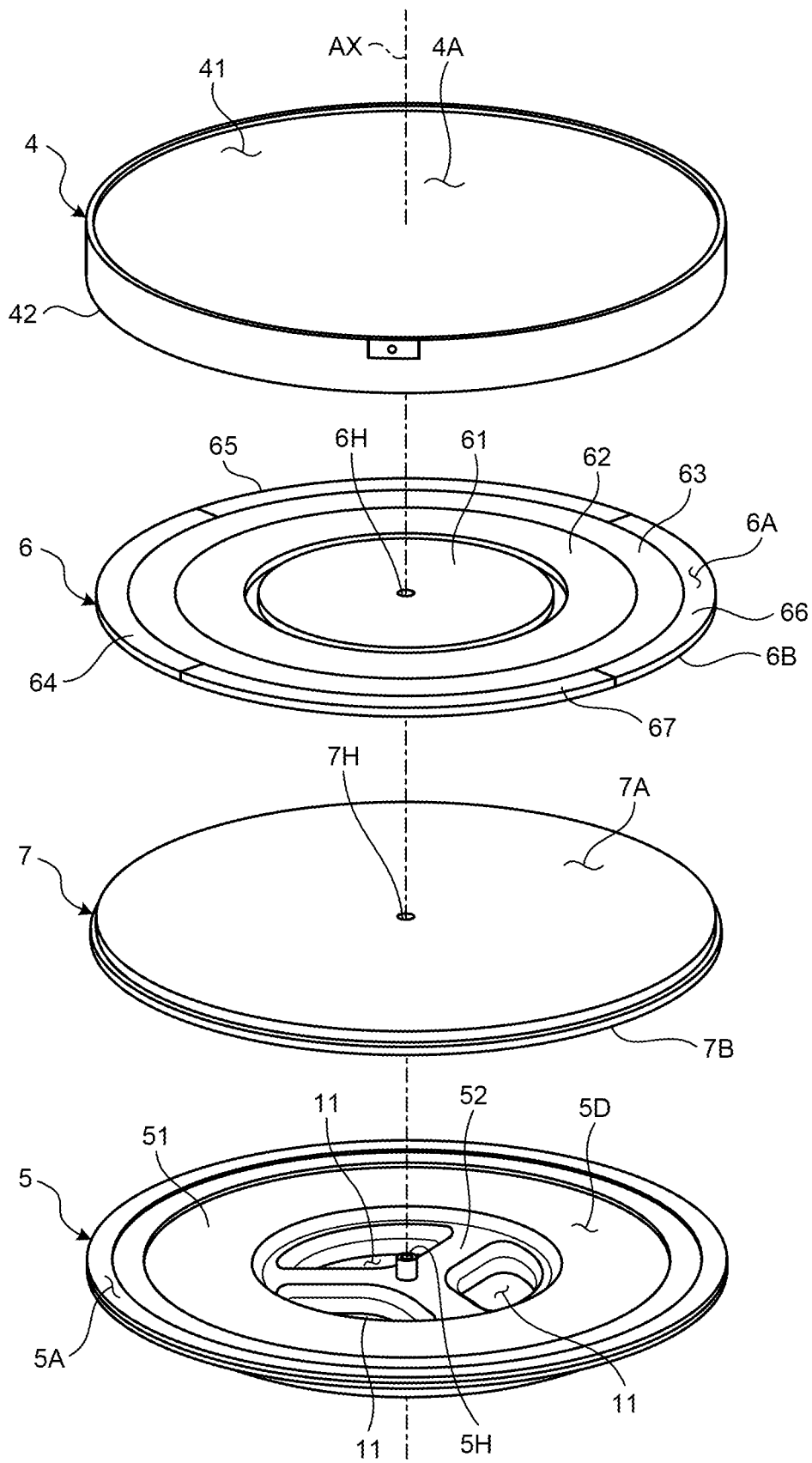
FIG. 3 is an exploded perspective view illustrating an example of the temperature control device according to the first embodiment.

FIG. 2 is a cross-sectional view schematically illustrating an example of the temperature control device 3 according to the present embodiment. FIG. 3 is an exploded perspective view illustrating an example of the temperature control device 3 according to the present embodiment.

As illustrated in FIGS. 1, 2, and 3, the temperature control device 3 includes: a top plate 4 that supports the substrate W; a base plate 5 connected to the top plate 4 so as to form an internal space 3S with the top plate 4; a thermoelectric module plate 6 arranged in the internal space 3S; a heat exchange plate 7 that is arranged in the internal space 3S and exchanges heat with the thermoelectric module plate 6; a coupling member 8 coupling the top plate 4 and the base plate 5; a lift pin 9 that supports a back surface of the substrate W to move the substrate W in the Z-axis direction; and a sealing member 10 that comes into contact with each of the top plate 4 and the base plate 5.

Each of the top plate 4, the thermoelectric module plate 6, the heat exchange plate 7, and the base plate 5 has a substantially disk shape. The top plate 4, the thermoelectric module plate 6, the heat exchange plate 7, and the base plate 5 are stacked in the Z-axis direction. In the following description, a virtual axis, which passes through the center of the temperature control device 3 in the XY plane and is parallel to the Z axis, is appropriately referred to as a central axis AX of the temperature control device 3.

The top plate 4 has a support surface 4A that supports the substrate W. The top plate 4 is made of, for example, aluminum. The top plate 4 may be made of stainless steel. The support surface 4A faces the +Z direction. The top plate 4 supports the substrate W such that the surface of the substrate W and the XY plane are parallel to each other. The substrate W is placed on the support surface 4A.

The top plate 4 has a disc-shaped support portion 41 having the support surface 4A and a back surface 4B facing the opposite direction of the support surface 4A, and a peripheral wall portion 42 which is connected to a peripheral edge portion of the support portion 41 and protrudes from the peripheral edge portion of the support portion 41 to the base plate 5.

The base plate 5 supports the top plate 4. The base plate 5 is made of, for example, aluminum. The base plate 5 may be made of stainless steel. The base plate 5 is arranged on the −Z side of the top plate 4, the thermoelectric module plate 6, and the heat exchange plate 7. The base plate 5 has an upper surface 5A facing a lower surface 4C of the peripheral wall portion 42 of the top plate 4, and an opposing surface 5D facing a lower surface 7B of the heat exchange plate 7 with a gap. Each of the upper surface 5A and the opposing surface 5D faces the +Z direction. The opposing surface 5D is arranged on the −Z side of the upper surface 5A. The upper surface 5A has an annular shape. In the XY plane, the upper surface 5A is arranged around the opposing surface 5D. The upper surface 5A comes into contact with the lower surface 4C of the peripheral wall portion 42. When the lower surface 4C of the peripheral wall portion 42 comes into contact with at least a part of the upper surface 5A of the base plate 5, the internal space 3S of the temperature control device 3 is formed between the top plate 4 and the base plate 5.

The base plate 5 has a convex portion 5T protruding from the opposing surface 5D to the support portion 41. At least a part of the convex portion 5T is arranged in a through hole 7J provided in the heat exchange plate 7. At least a part of the convex portion 5T is arranged in a through hole 6J provided in the thermoelectric module plate 6. An upper end of the convex portion 5T is connected to the support portion 41 of the top plate 4.

The base plate 5 has a convex portion 5U protruding from the opposing surface 5D to the support portion 41. In the radial direction of the central axis AX, the convex portion 5U is arranged between the central axis AX and the convex portion 5T. At least a part of the convex portion 5U is arranged in a through hole 7K provided in the heat exchange plate 7. At least a part of the convex portion 5U is arranged in a through hole 6K provided in the thermoelectric module plate 6. An upper end of the convex portion 5U is connected to the support portion 41 of the top plate 4.

The thermoelectric module plate 6 adjusts the temperature of the substrate W supported by the support surface 4A of the top plate 4. The thermoelectric module plate 6 includes a thermoelectric module 20 that absorbs heat or generates heat by supplying electric power. The thermoelectric module plate 6 is arranged in the internal space 3S. The thermoelectric module plate 6 is arranged on the −Z side of the support portion 41 of the top plate 4. The thermoelectric module plate 6 is arranged so as to be adjacent to the top plate 4 in the internal space 3S. An upper surface 6A of the thermoelectric module plate 6 faces the back surface 4B of the support portion 41.

The thermoelectric module 20 absorbs heat or generates heat by the Peltier effect. The thermoelectric module 20 can take heat from the substrate W supported by the support surface 4A via the support portion 41. The thermoelectric module 20 can apply heat to the substrate W supported by the support surface 4A via the support portion 41. As the thermoelectric module 20 absorbs heat or generates heat, the temperature of the substrate W supported by the support surface 4A is adjusted.

The thermoelectric module plate 6 includes the thermoelectric module 20, a first insulating film 21 connected to an upper surface of the thermoelectric module 20, a second insulating film 22 connected to a lower surface of the thermoelectric module 20, and a partition member 23 arranged around the thermoelectric module 20. The thermoelectric module 20 is arranged in a space defined by the first insulating film 21, the second insulating film 22, and the partition member 23. Each of the first insulating film 21 and the second insulating film 22 includes, for example, a film made of polyimide. The upper surface 6A of the thermoelectric module plate 6 includes an upper surface of the first insulating film 21. A lower surface 6B of the thermoelectric module plate 6 includes a lower surface of the second insulating film 22.

As illustrated in FIG. 3, the thermoelectric module plate 6 includes a first thermoelectric module plate 61, a second thermoelectric module plate 62, a third thermoelectric module plate 63, a fourth thermoelectric module plate 64, a fifth thermoelectric module plate 65, a sixth thermoelectric module plate 66, and a seventh thermoelectric module plate 67. The first thermoelectric module plate 61 is a circular plate arranged at the center in the XY plane. The central axis AX passes through the first thermoelectric module plate 61. The second thermoelectric module plate 62 is an annular plate arranged around the first thermoelectric module plate 61. The third thermoelectric module plate 63 is an annular plate arranged around the second thermoelectric module plate 62. The fourth thermoelectric module plate 64 is an arc-shaped plate arranged in a part around the third thermoelectric module plate 63. The fifth thermoelectric module plate 65 is an arc-shaped plate arranged next to the fourth thermoelectric module plate 64 in a part around the third thermoelectric module plate 63. The sixth thermoelectric module plate 66 is an arc-shaped plate arranged next to the fifth thermoelectric module plate 65 in a part around the third thermoelectric module plate 63. The seventh thermoelectric module plate 67 is an arc-shaped plate arranged between the fourth thermoelectric module plate 64 and the sixth thermoelectric module plate 66 in a part around the third thermoelectric module plate 63.

Each of the first to seventh thermoelectric module plates 61 to 67 has the thermoelectric module 20, the first insulating film 21, the second insulating film 22, and the partition member 23. Each of the first to seventh thermoelectric module plates 61 to 67 has the upper surface 6A and the lower surface 6B.

The heat exchange plate 7 exchanges heat with the thermoelectric module plate 6. The heat exchange plate 7 is arranged on the −Z side of the thermoelectric module plate 6 in the internal space 3S. In the Z-axis direction, the thermoelectric module plate 6 is arranged between the support portion 41 and the heat exchange plate 7. In the Z-axis direction, the heat exchange plate 7 is arranged between the thermoelectric module plate 6 and the base plate 5. The heat exchange plate 7 is arranged so as to be adjacent to the thermoelectric module plate 6 in an internal space 3A. An upper surface 7A of the heat exchange plate 7 faces the lower surface 6B of the thermoelectric module 20.

When the thermoelectric module 20 takes heat from the substrate W supported by the support surface 4A, the heat of the substrate W is transferred to the heat exchange plate 7 via the support portion 41 and the thermoelectric module plate 6. The heat exchange plate 7 has an internal flow path (not illustrated) through which a temperature control fluid flows. The temperature control fluid contains a refrigerant such as cooling water. The temperature control fluid is adjusted in temperature by a fluid temperature adjustment device (not illustrated), and then, flows into the internal flow path through an inlet of the internal flow path. The temperature control fluid flows through the internal flow path and takes heat transferred to the heat exchange plate 7. The temperature control fluid having taken the heat flows out from an outlet of the internal flow path and is returned to the fluid temperature adjustment device.

The heat exchange plate 7 is made of copper. The copper has a high thermal conductivity. Therefore, the heat exchange plate 7 can efficiently exchange heat with the thermoelectric module plate 6.

The coupling member 8 couples the top plate 4 and the base plate 5 via the thermoelectric module plate 6 and the heat exchange plate 7. A plurality of the coupling members 8 are provided. The coupling member 8 includes a bolt. The base plate 5 has a concave portion 5C in which a head of the coupling member 8 is arranged. The concave portion 5C is provided on a lower surface 5B of the base plate 5.

The base plate 5 has a through hole 5H in which at least a part of a shaft portion of the coupling member 8 is arranged. The heat exchange plate 7 has a through hole 7H in which at least a part of the shaft portion of the coupling member 8 is arranged. The thermoelectric module plate 6 has a through hole 6H in which at least a part of the shaft portion of the coupling member 8 is arranged. The top plate 4 has a screw hole 4H into which a distal end of the shaft portion of the coupling member 8 is inserted. The coupling member 8 couples the top plate 4 and the base plate 5 through the through hole 6H of the thermoelectric module plate 6 and the through hole 7H of the heat exchange plate 7.

The coupling members 8 include a first coupling member 81 to be coupled to a first part P1 of the top plate 4 and second coupling members 82 to be coupled to a plurality of second parts P2 of the top plate 4 defined around the first part P1. The first part P1 is defined in a central part of the support portion 41 of the top plate 4 in the XY plane. The plurality of second parts P2 are defined around the first part P1 of the support portion 41 of the top plate 4 in the XY plane. In the present embodiment, the second parts P2 are defined at six locations around the first part P1. The second parts P2 may be defined at least three places around the first part P1. The first coupling member 81 couples the first part P1 of the top plate 4 and the base plate 5 via the thermoelectric module plate 6 and the heat exchange plate 7. The second coupling members 82 couple the second parts P2 of the top plate 4 and the base plate 5 via the thermoelectric module plate 6 and the heat exchange plate 7.

Among the plurality of second coupling members 82, at least one second coupling member 82 is arranged in a through hole 5J provided in the convex portion 5T.

The top plate 4 has a convex portion 4T protruding from the back surface 4B to the base plate 5. The screw hole 4H into which the first coupling member 81 is inserted is provided in the convex portion 4T. The heat exchange plate 7 has the through hole 7H in which the first coupling member 81 and the convex portion 4T are arranged. The thermoelectric module plate 6 has the through hole 6H in which the first coupling member 81 and the convex portion 4T are arranged. A lower end surface of the convex portion 4T comes into contact with an upper end surface of a convex portion 5S provided on the base plate 5 with a heat insulator 40 interposed therebetween.

The lift pin 9 supports a back surface of the substrate W and moves the substrate W in the Z-axis direction such that the substrate W approaches or separates from the support surface 4A. At least a part of the lift pin 9 is arranged in a through hole 5W provided in the convex portion 5U. At least a part of the lift pin 9 is arranged in a through hole 4W provided in the top plate 4. A space inside the through hole 5W and a space inside the through hole 4W are connected to the internal space 2S of the chamber device 2.

The internal space 3S is open to the atmosphere. The internal space 3S is maintained at atmospheric pressure. The internal space 3S is connected to an external space (atmospheric space) of the chamber device 2 via a passage 11. At least a part of the passage 11 is provided in the base plate 5. As illustrated in FIG. 3, the base plate 5 has an annular rim portion 51 and a spoke portion 52 arranged on the inner side of the rim portion 51. The passage 11 is provided between the rim portion 51 and the spoke portion 52. The spoke portion 52 is provided with the through hole 5H in which the coupling member 8 to be coupled to the first part P1 of the top plate 4 is arranged.

The internal space 3S of the temperature control device 3 is maintained at atmospheric pressure. The internal space 2S of the chamber device 2 around the temperature control device 3 is maintained at a pressure lower than the atmospheric pressure. Since the pressure in the internal space 3S of the temperature control device 3 is higher than the pressure in the internal space 2S of the chamber device 2, the etching gas supplied to the internal space 2S of the chamber device 2 is suppressed from flowing into the internal space 3S of the temperature control device 3. As a result, contact between the etching gas and the thermoelectric module 20 is suppressed. For example, when the etching gas is corrosive, it is preferable that the etching gas not come into contact with the thermoelectric module 20. Since the pressure in the internal space 3S of the temperature control device 3 is higher than the pressure in the internal space 2S of the chamber device 2 in the present embodiment, the contact between the etching gas and the thermoelectric module 20 is suppressed.

The sealing member 10 comes into contact with each of the top plate 4 and the base plate 5. The sealing member 10 seals a boundary between the peripheral wall portion 42 of the top plate 4 and the base plate 5. Since the sealing member 10 is provided, the etching gas supplied to the internal space 2S of the chamber device 2 is suppressed from flowing into the internal space 3S of the temperature control device 3. In addition, a gas in the internal space 3S of the temperature control device 3 is suppressed from flowing out to the internal space 2S of the chamber device 2 since the sealing member 10 is provided. For example, foreign matter generated from at least one of the thermoelectric module plate 6 and the heat exchange plate 7 is suppressed from flowing out to the internal space 2S of the chamber device 2. As a result, the foreign matter is suppressed from adhering to the substrate W supported by the support surface 4A. In the present embodiment, the heat exchange plate 7 is made of copper. If foreign matter containing copper adheres to the substrate W, there is a possibility that the performance of a semiconductor device manufactured using the substrate W may deteriorate. Since the sealing member 10 is provided, the foreign matter generated in the internal space 3S of the temperature control device 3 is suppressed from adhering to the substrate W supported by the support surface 4A.

Thermoelectric Module

Figure 4:
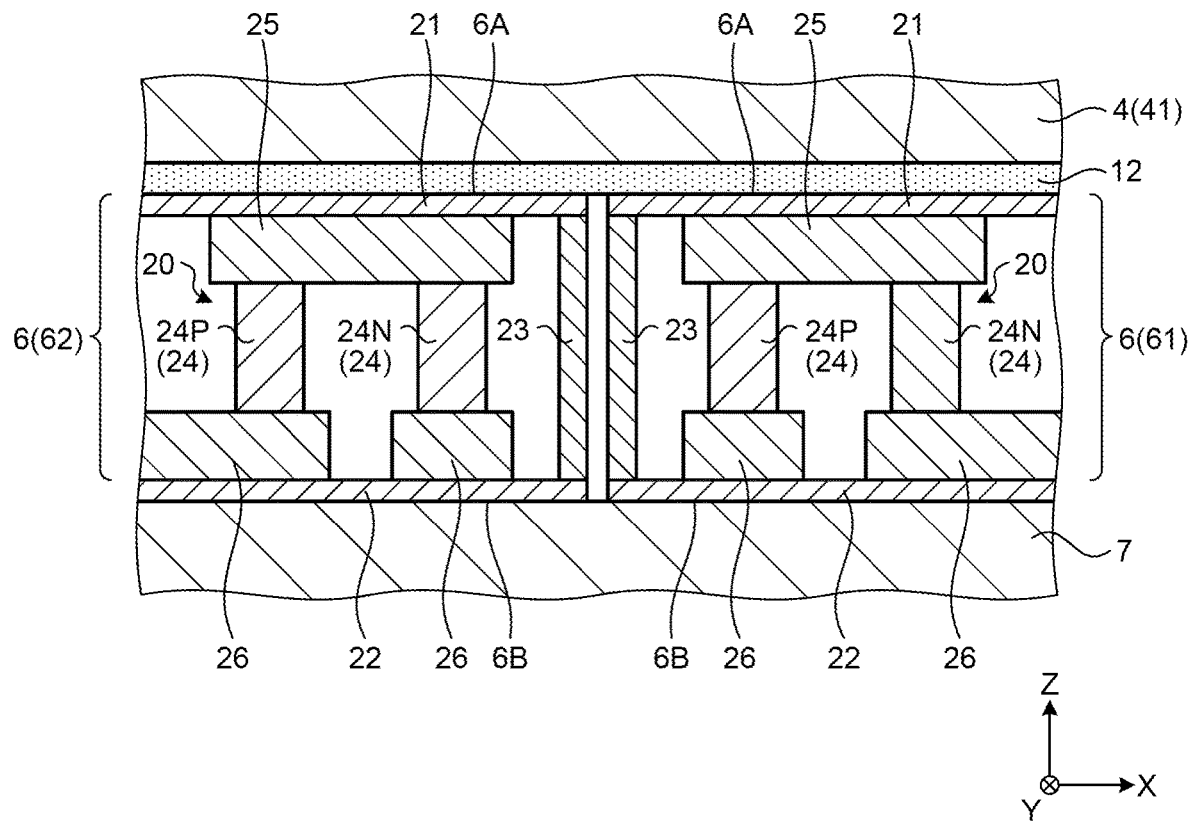
FIG. 4 is an enlarged cross-sectional view of a part of a thermoelectric module plate according to the first embodiment.
Figure 5:
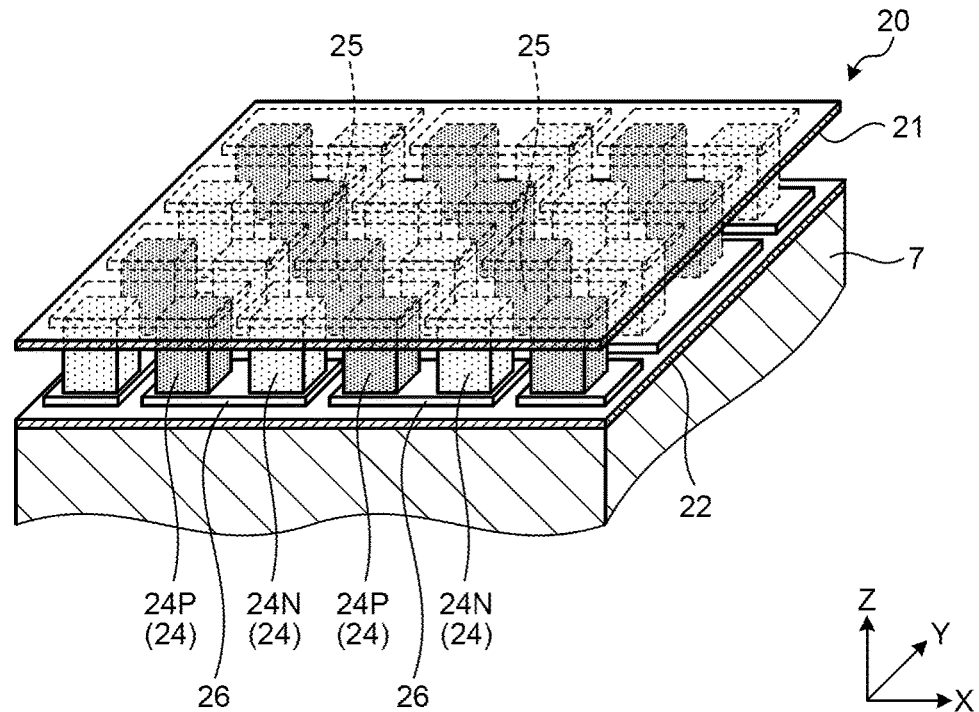
FIG. 5 is a perspective view illustrating a part of a thermoelectric module according to the first embodiment.

FIG. 4 is an enlarged cross-sectional view of a part of the thermoelectric module plate 6 according to the present embodiment. FIG. 5 is a perspective view illustrating a part of the thermoelectric module plate 6 according to the present embodiment. Note that FIG. 4 is an enlarged cross-sectional view of a boundary between the first thermoelectric module plate 61 and the second thermoelectric module plate 62. A structure of each boundary among the second thermoelectric module plate 62 to the seventh thermoelectric module plate 67 is the same as a structure of the boundary between the first thermoelectric module plate 61 and the second thermoelectric module plate 62.

As illustrated in FIGS. 4 and 5, the thermoelectric module plate 6 includes the thermoelectric module 20, the first insulating film 21 connected to the upper surface of the thermoelectric module 20, the second insulating film 22 connected to the lower surface of the thermoelectric module 20, and the partition member 23 arranged around the thermoelectric module 20. The thermoelectric module 20 is arranged in a space defined by the first insulating film 21, the second insulating film 22, and the partition member 23. Each of the first insulating film 21 and the second insulating film 22 includes, for example, a film made of polyimide. The upper surface 6A of the thermoelectric module plate 6 includes an upper surface of the first insulating film 21. A lower surface 6B of the thermoelectric module plate 6 includes a lower surface of the second insulating film 22.

The partition member 23 is arranged between the first insulating film 21 and the second insulating film 22. The partition member 23 is an annular member provided so as to surround a space in which the thermoelectric module 20 is arranged. The partition member 23 is made of ceramics. The partition member 23 may be made of aluminum oxide or aluminum nitride. The partition member 23 is joined to each of the first insulating film 21 and the second insulating film 22 by an adhesive.

The thermoelectric module 20 has a thermoelectric semiconductor element 24, a first electrode 25, and a second electrode 26. The thermoelectric semiconductor element 24 includes a p-type thermoelectric semiconductor element 24P and an n-type thermoelectric semiconductor element 24N. In the XY plane, the p-type thermoelectric semiconductor element 24P and the n-type thermoelectric semiconductor element 24N are arranged alternately. The first electrode 25 is connected to each of the p-type thermoelectric semiconductor element 24P and the n-type thermoelectric semiconductor element 24N. The second electrode 26 is connected to each of the p-type thermoelectric semiconductor element 24P and the n-type thermoelectric semiconductor element 24N. An upper surface of the p-type thermoelectric semiconductor element 24P and an upper surface of the n-type thermoelectric semiconductor element 24N are connected to the first electrode 25. A lower surface of the p-type thermoelectric semiconductor element 24P and a lower surface of the n-type thermoelectric semiconductor element 24N are connected to the second electrode 26. The first electrode 25 is connected to the first insulating film 21. The second electrode 26 is connected to the second insulating film 22. The upper surface of the thermoelectric module 20 includes an upper surface of the first electrode 25. The lower surface of the thermoelectric module 20 includes a lower surface of the second electrode 26.

The thermoelectric module 20 absorbs heat or generates heat by the Peltier effect. When a potential difference is applied between the first electrode 25 and the second electrode 26, electric charges move in the thermoelectric semiconductor element 24. Due to the movement of electric charges, heat is transferred in the thermoelectric semiconductor element 24. As a result, the thermoelectric module 20 absorbs heat or generates heat. In the present embodiment, the potential difference is applied between the first electrode 25 and the second electrode 26 such that the first electrode 25 connected to an end on the +Z side of the thermoelectric semiconductor element 24 absorbs heat, and the second electrode 26 connected to an end on the −Z side of the thermoelectric semiconductor element 24 generates heat. The substrate W supported by the support surface 4A is cooled by the heat absorption of the first electrode 25. Note that the potential difference may be applied between the first electrode 25 and the second electrode 26 such that the first electrode 25 generates heat and the second electrode 26 absorbs heat. As the first electrode 25 generates heat, the substrate W supported by the support surface 4A is heated.

The first insulating film 21 of the thermoelectric module plate 6 is adjacent to the support portion 41 of the top plate 4. A viscoelastic film 12 is provided between the support portion 41 of the top plate 4 and the first insulating film 21 of the thermoelectric module plate 6. The viscoelastic film 12 contains heat conductive grease. The viscoelastic film 12 may include a gel sheet. As the first electrode 25 absorbs heat, the heat of the substrate W supported by the support surface 4A is transferred to the heat exchange plate 7 via the support portion 41, the viscoelastic film 12, and the thermoelectric module plate 6.

The second insulating film 22 is joined to the heat exchange plate 7. The second insulating film 22 is joined to the heat exchange plate 7 by, for example, an adhesive.

Sealing Member

FIG. 6 is a cross-sectional view illustrating an example of the sealing member 10 according to the present embodiment. The sealing member 10 is, for example, an O-ring made of fluororubber. As illustrated in FIG. 6, the sealing member 10 comes into contact with each of the top plate 4, the base plate 5, and the heat exchange plate 7. The sealing member 10 is arranged in a sealing space 13 defined by the top plate 4, the base plate 5, and the heat exchange plate 7. The sealing member 10 is replaceable.

The heat exchange plate 7 has the upper surface 7A facing the lower surface 6B of the thermoelectric module plate 6, the lower surface 7B facing the upper surface 5A of the base plate 5, and a side surface 7D facing an inner surface 4D of the peripheral wall portion 42 of the top plate 4 with a gap. The lower surface 7B is substantially parallel to the XY plane. The side surface 7D is substantially parallel to the Z axis.

The inner surface 4D of the peripheral wall portion 42 is substantially parallel to the side surface 7D of the heat exchange plate 7. The upper surface 5A of the base plate 5 is substantially parallel to the XY plane. In a cross section parallel to the Z axis, the inner surface 4D has a linear shape. In the cross section parallel to the Z axis, the upper surface 5A has a linear shape.

The heat exchange plate 7 has a tapered surface 7C that is inclined to the central axis AX side of the heat exchange plate 7 toward the upper surface 5A of the base plate 5. The tapered surface 7C is formed so as to connect the side surface 7D and the lower surface 7B. In the cross section parallel to the Z axis, the tapered surface 7C has a linear shape. The tapered surface 7C is formed by chamfering (C chamfering) corners defined by the side surface 7D and the lower surface 7B of the heat exchange plate 7.

The sealing space 13 in which the sealing member 10 is arranged is defined by the inner surface 4D of the peripheral wall portion 42 of the top plate 4, the upper surface 5A of the base plate 5, and the tapered surface 7C of the heat exchange plate 7. The sealing member 10 arranged in the sealing space 13 comes into contact with each of the inner surface 4D of the peripheral wall portion 42 of the top plate 4, the upper surface 5A of the base plate 5, and the tapered surface 7C of the heat exchange plate 7.

As being arranged in the sealing space 13, the sealing member 10 is pressed by the inner surface 4D of the peripheral wall portion 42 of the top plate 4, the upper surface 5A of the base plate 5, and the tapered surface 7C of the heat exchange plate 7. As described above, each of the inner surface 4D, the upper surface 5A, and the tapered surface 7C has the linear shape in the cross section parallel to the Z axis. As being arranged in the sealing space 13, the sealing member 10 is crushed by each of the peripheral wall portion 42 of the top plate 4, the base plate 5, and the heat exchange plate 7 such that a shape of the cross section parallel to the Z axis becomes a triangle. The surface of the sealing member 10 is in close contact with each of the inner surface 4D, the upper surface 5A, and the tapered surface 7C at a boundary between the lower surface 4C of the peripheral wall portion 42 and the upper surface 5A of the base plate 5. As a result, the boundary between the lower surface 4C of the peripheral wall portion 42 and the upper surface 5A of the base plate 5 is sufficiently sealed by the sealing member 10.

The sealing member 10 is arranged between the peripheral wall portion 42 and the heat exchange plate 7 in the radial direction of the central axis AX. In addition, at least a part of the sealing member 10 is arranged so as to sneak into the lower side of the heat exchange plate 7 since the tapered surface 7C is provided. As a result, even if a thickness TH of the peripheral wall portion 42 is made thin, the boundary between the lower surface 4C of the peripheral wall portion 42 and the upper surface 5A of the base plate 5 is sufficiently sealed by the sealing member 10. Note that the thickness TH of the peripheral wall portion 42 refers to a dimension of the peripheral wall portion 42 in the radial direction of the central axis AX.

Since the thickness TH of the peripheral wall portion 42 can be made thin, a size of the internal space 3S in the XY plane can be increased in a state where a size of the support surface 4A is maintained. That is, the size of the internal space 3S in the XY plane can be made close to the size of the support surface 4A.

In addition, a size of the thermoelectric module plate 6 in the XY plane can be increased by increasing the size of the internal space 3S in the XY plane. That is, the size of the thermoelectric module plate 6 in the XY plane can be made close to the size of the support surface 4A since the thickness TH of the peripheral wall portion 42 can be made thin. Since the size of the thermoelectric module plate 6 can be increased, the temperature adjustment can be sufficiently performed up to an edge of the substrate W supported by the support surface 4A.

Operation

Next, an operation of the temperature control device 3 according to the present embodiment will be described. The internal space 2S of the chamber device 2 is depressurized. The substrate W is carried into the internal space 2S of the chamber device 2. The lift pin 9 ascends such that an upper end of the lift pin 9 is arranged above the support surface 4A. The lift pin 9 supports the back surface of the substrate W conveyed to the internal space 2S. The lift pin 9 that supports the back surface of the substrate W descends. As the lift pin 9 descends, the substrate W is supported by the support surface 4A of the top plate 4.

When a potential difference is applied to the thermoelectric module 20, the temperature control device 3 starts adjusting the temperature of the substrate W supported by the support surface 4A. In the present embodiment, the thermoelectric module plate 6 includes the first to seventh thermoelectric module plates 61 to 67. The temperature of the substrate W can be adjusted separately by each of the first to seventh thermoelectric module plates 61 to 67. As a potential difference applied to each of the first to seventh thermoelectric module plates 61 to 67 is adjusted, the temperature control device 3 can adjust the temperature distribution of the substrate W.

An etching gas is supplied to the internal space 2S of the chamber device 2. The chamber member 2T is heated by the temperature adjustment device 2U. As the chamber member 2T is heated, it is possible to suppress foreign matter generated by an etching process from adhering to an inner surface of the chamber member 2T.

When the chamber member 2T is heated, there is a possibility that the temperature of the substrate W supported by the support surface 4A of the temperature control device 3 becomes excessively higher than a target temperature, or the temperature distribution of the substrate W does not reach a target temperature distribution. The temperature control device 3 adjusts the temperature of the substrate W such that the substrate W reaches the target temperature even when the chamber member 2T is heated. In addition, the temperature control device 3 adjusts the temperature distribution of the substrate W such that the substrate W has the target temperature distribution even when the chamber member 2T is heated.

The distance between the peripheral edge portion of the substrate W supported by the support surface 4A and the chamber member 2T is short. There is a high possibility that the temperature of the peripheral edge portion of the substrate W may become excessively high due to radiant heat of the chamber member 2T.

In the present embodiment, the tapered surface 7C is formed on the heat exchange plate 7, and the thickness TH of the peripheral wall portion 42 is sufficiently thin. The thickness TH is the dimension of the peripheral wall portion 42 in the XY plane. In the XY plane, a difference between the size of the substrate W supported by the support surface 4A and the size of the thermoelectric module plate 6 is small. In the XY plane, at least a part of the thermoelectric module 20 is arranged at a position close to the peripheral edge portion of the substrate W. As a result, the thermoelectric module plate 6 can sufficiently adjust not only the temperature of the central portion of the substrate W but also the temperature of the peripheral edge portion of the substrate W via the support portion 41.

The sealing member 10 seals the boundary between the lower surface 4C of the peripheral wall portion 42 and the upper surface 5A of the base plate 5. The sealing member 10 suppresses the etching gas supplied to the internal space 2S of the chamber device 2 from flowing into the internal space 3S of the temperature control device 3. In addition, a gas in the internal space 3S of the temperature control device 3 is suppressed from flowing out to the internal space 2S of the chamber device 2 since the sealing member 10 is provided.

After the etching process is completed, the lift pin 9 ascends. The lift pin 9 ascends in the state of supporting the back surface of the substrate W. As a result, the back surface of the substrate W and the support surface 4A of the top plate 4 are separated from each other. The substrate W separated from the top plate 4 is carried out from the chamber device 2 by an unloading device (not illustrated).

Effect

As described above, the internal space 3S in which the thermoelectric module plate 6 is arranged is defined by the top plate 4 and the base plate 5 connected to the top plate 4 according to the present embodiment. The temperature control device 3 having the internal space 3S in which the thermoelectric module plate 6 is arranged is provided with the sealing member 10 that comes into contact with each of the top plate 4 and the base plate 5. Since the sealing member 10 is provided, the flow of the gas between the internal space 3S of the temperature control device 3 and the external space of the temperature control device 3 (internal space 2S of the chamber device 2) is suppressed.

When the temperature control device 3 is arranged in the internal space 2S of the chamber device 2, the pressure in the internal space 3S of the temperature control device 3 is maintained at a pressure higher than the pressure in the internal space 2S of the chamber device 2 such that the etching gas supplied to the internal space 2S of the chamber device 2 is suppressed from flowing into the internal space 3S of the temperature control device 3. Since the pressure in the internal space 3S of the temperature control device 3 is higher than the pressure in the internal space 2S of the chamber device 2, the etching gas supplied to the internal space 2S of the chamber device 2 is suppressed from flowing into the internal space 3S of the temperature control device 3. Further, since the sealing member 10 sealing the boundary between the peripheral wall portion 42 of the top plate 4 and the base plate 5 is provided, the etching gas supplied to the internal space 2S of the chamber device 2 is more effectively suppressed from flowing into the internal space 3S of the temperature control device 3. As a result, contact between the etching gas and the thermoelectric module 20 is suppressed. For example, when the etching gas is corrosive, it is preferable that the etching gas and the thermoelectric module 20 not come into contact with each other from the viewpoint of maintaining the performance of the thermoelectric module 20. Since the pressure in the internal space 3S of the temperature control device 3 is higher than the pressure in the internal space 2S of the chamber device 2 in the present embodiment, the contact between the etching gas and the thermoelectric module 20 is suppressed.

In addition, a gas in the internal space 3S of the temperature control device 3 is suppressed from flowing out to the internal space 2S of the chamber device 2 since the sealing member 10 is provided. For example, foreign matter generated from at least one of the thermoelectric module plate 6 and the heat exchange plate 7 is suppressed from flowing out to the internal space 2S of the chamber device 2. As a result, the foreign matter is suppressed from adhering to the substrate W supported by the support surface 4A. In the present embodiment, the heat exchange plate 7 is made of copper. If foreign matter containing copper adheres to the substrate W, there is a possibility that the performance of a semiconductor device manufactured using the substrate W may deteriorate. Since the sealing member 10 is provided, the foreign matter generated in the internal space 3S of the temperature control device 3 is sufficiently suppressed from adhering to the substrate W supported by the support surface 4A.

The chamber member 2T is heated by the temperature adjustment device 2U. The temperature control device 3 is used in a high-temperature environment. If the top plate 4 and the base plate 5 forming the internal space 3S are joined, for example, by an adhesive in the case where the temperature control device 3 is used in the high-temperature environment, there is a possibility that the adhesive may be peeled off due to a difference in the amount of thermal deformation or a difference in coefficient of thermal expansion between the top plate 4 and the base plate 5. If the adhesive is peeled off, the boundary between the top plate 4 and the base plate 5 is not sufficiently sealed, and there is a possibility that a gas may flow out from the internal space 3S to the external space, or a gas may flow from the external space into the internal space 3S.

In the present embodiment, the boundary between the top plate 4 and the base plate 5 is sealed by the sealing member 10. Therefore, even if the temperature control device 3 is used in the high-temperature environment, the flow of the gas between the internal space 3S of the temperature control device 3 and the external space of the temperature control device 3 is sufficiently suppressed.

The sealing member 10 is easily replaceable. Therefore, the sealing member 10 can be easily replaced with a new sealing member 10, for example, when being degraded or contaminated. As a result, maintenance cost can be reduced. In addition, the sealing member 10 can be easily replaced with the sealing member 10 made of the optimum material based on a type of etching gas.

The sealing member 10 is arranged so as to come into contact with not only the top plate 4 and the base plate 5 but also the heat exchange plate 7. As a result, a position of the sealing member 10 is sufficiently fixed, and the sealing member 10 can fully exert the sealing function.

The sealing member 10 is arranged in a sealing space 13 defined by the top plate 4, the base plate 5, and the heat exchange plate 7. As a result, a position of the sealing member 10 is sufficiently fixed, and the sealing member 10 can fully exert the sealing function.

The sealing space 13 is defined by the inner surface 4D of the peripheral wall portion 42 of the top plate 4, the upper surface 5A of the base plate 5, and the tapered surface 7C of the heat exchange plate 7. As a result, the thickness TH of the peripheral wall portion 42 can be made thin, and the difference between the size of the thermoelectric module plate 6 and the size of the substrate W can be reduced. Therefore, the temperature control device 3 can sufficiently adjust not only the temperature of the central portion of the substrate W but also the temperature of the peripheral edge portion of the substrate W. The distance between the peripheral edge portion of the substrate W and the chamber member 2T is shorter than the distance between the central portion of the substrate W and the chamber member 2T. Therefore, there is a high possibility that the temperature of the peripheral edge portion of the substrate W may rise excessively due to the radiant heat of the chamber member 2T. Since even the temperature of the peripheral edge portion of the substrate W can be sufficiently adjusted in the present embodiment, it is possible to suppress the excessive temperature rise of the peripheral edge portion of the substrate W due to the radiant heat of the chamber member 2T even if the chamber member 2T is heated. Since the excessive temperature rise of the peripheral edge portion of the substrate W is suppressed, a high-quality semiconductor device is manufactured in the vicinity of the peripheral edge portion of the substrate W.

In addition, heat from the substrate W transferred to the heat exchange plate 7 via the thermoelectric module plate 6 is suppressed from returning to the substrate W via the peripheral wall portion 42 since the thickness TH of the peripheral wall portion 42 can be made thin.

Second Embodiment

A second embodiment will be described. In the following description, constituent elements that are equivalent to those in the above-described embodiment will be denoted by the same reference signs, and the description thereof will be simplified or omitted.

Figure 7:
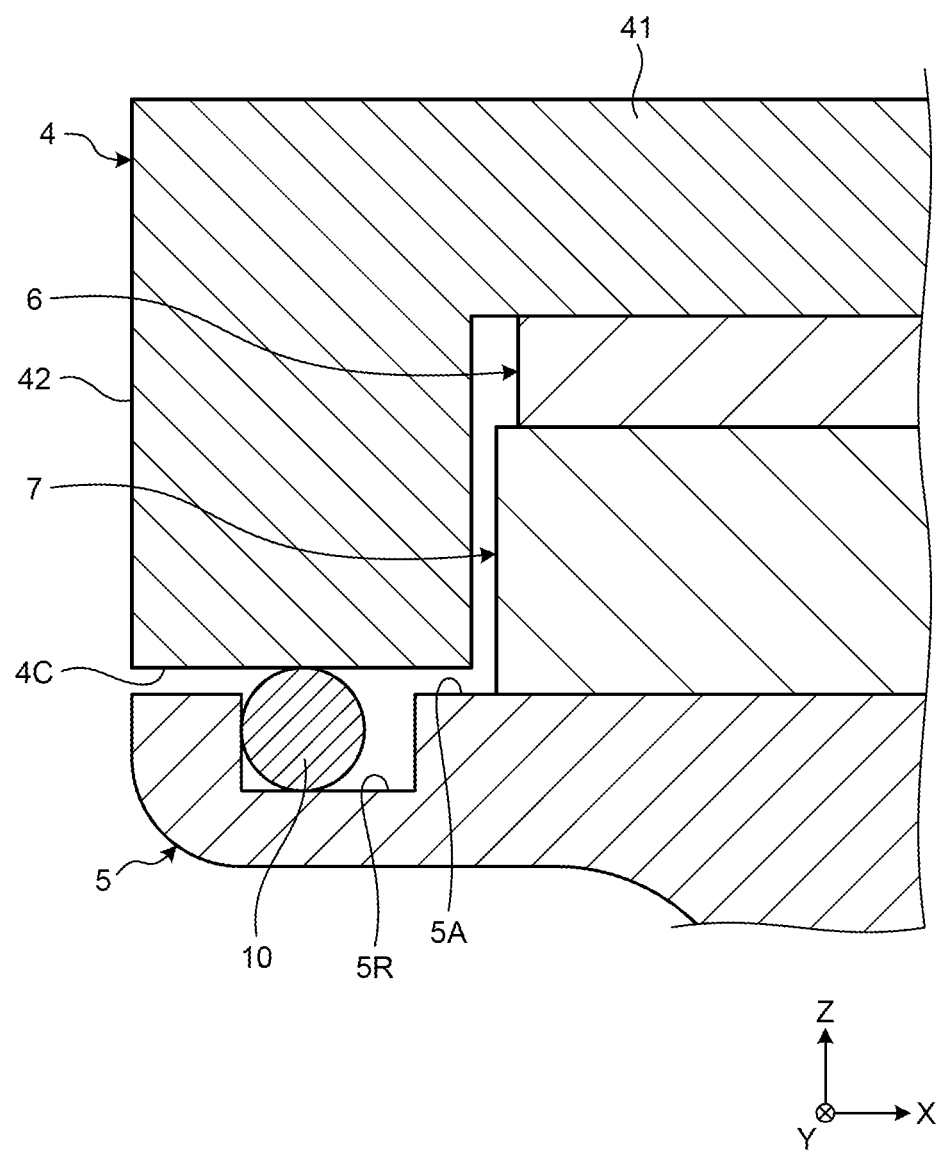
FIG. 7 is a cross-sectional view illustrating an example of a sealing member according to a second embodiment.

FIG. 7 is a cross-sectional view illustrating an example of the sealing member 10 according to the present embodiment. As illustrated in FIG. 7, the sealing member 10 is arranged between the top plate 4 and the base plate 5 in the present embodiment. A concave portion 5R is formed on the upper surface 5A of the base plate 5. The concave portion 5R faces the lower surface 4C of the peripheral wall portion 42 of the top plate 4. The sealing member 10 is arranged in the concave portion 5R. The sealing member 10 arranged in the concave portion 5R comes into contact with the lower surface 4C of the peripheral wall portion 42.

Even in the present embodiment, the sealing member 10 can sufficiently seal a boundary between the top plate 4 and the base plate 5 forming the internal space 3S.

The invention claimed is:
1. A temperature control device comprising:
a top plate configured to support a substrate;
a base plate that is connected to the top plate and defines an internal space with the top plate;
a thermoelectric module plate arranged in the internal space;
a heat exchange plate that is arranged in the internal space and configured to exchange heat with the thermoelectric module plate; and
a sealing member that is in direct contact with each of the heat exchange plate, the top plate, and the base plate.
2. The temperature control device according to claim 1, wherein the sealing member is arranged in a sealing space defined by the top plate, the base plate, and the heat exchange plate.
3. The temperature control device according to claim 2, wherein:
the top plate comprises (i) a support portion that defines a support surface supporting the substrate and (ii) a peripheral wall portion that is connected to a peripheral edge portion of the support portion and protrudes from the support portion to the base plate;

the base plate has an upper surface facing a lower surface of the peripheral wall portion;

the heat exchange plate has a tapered surface that is inclined to a central axis side of the heat exchange plate toward the upper surface of the base plate; and the sealing space is defined by an inner surface of the peripheral wall portion of the top plate, the upper surface of the base plate, and the tapered surface of the heat exchange plate.

4. The temperature control device according to claim 1, wherein the sealing member is disposed below the thermoelectric module plate.

5. The temperature control device according to claim 1, wherein the top plate comprises a peripheral wall portion that extends from a lower surface of the top plate to an upper surface of the base plate, and wherein the sealing member is in direct contact with the peripheral wall portion of the top plate and the upper surface of the base plate.

6. The temperature control device according to claim 1, wherein the thermoelectric module plate is disposed above an upper surface of the heat exchange plate, and wherein the sealing member is disposed below the upper surface of the heat exchange plate.

7. The temperature control device according to claim 1, wherein each of the top plate, the base plate, the thermoelectric module plate, and the heat exchange plate has a circular shape around a central axis, and wherein the central axis passes through centers of the top plate, the base plate, and the thermoelectric module plate.

8. The temperature control device according to claim 1, wherein the sealing member comprises an O-ring made of fluororubber.

* * * * *